United States Patent
Alshinnawi et al.

(10) Patent No.: US 9,214,795 B2
(45) Date of Patent: Dec. 15, 2015

(54) EXTENDABLE COMPONENT POWER CABLE

(75) Inventors: Shareef F. Alshinnawi, Durham, NC (US); Gary D. Cudak, Creedmoor, NC (US); Edward S. Suffern, Chapel Hill, NC (US); J. Mark Weber, Wake Forest, NC (US)

(73) Assignee: Lenovo Enterprise Solutions (Singapore) Pte. Ltd. (SG)

( * ) Notice: Subject to any disclaimer, the term of this patent is extended or adjusted under 35 U.S.C. 154(b) by 426 days.

(21) Appl. No.: 13/610,039

(22) Filed: Sep. 11, 2012

(65) Prior Publication Data
US 2014/0069680 A1    Mar. 13, 2014

(51) Int. Cl.
| | |
|---|---|
| *H01B 7/06* | (2006.01) |
| *H02G 3/00* | (2006.01) |
| *H01B 7/00* | (2006.01) |
| *H02G 15/02* | (2006.01) |
| *H02G 11/00* | (2006.01) |
| *H05K 7/14* | (2006.01) |

(52) U.S. Cl.
CPC ........... *H02G 11/003* (2013.01); *H05K 7/1492* (2013.01)

(58) Field of Classification Search
CPC .. H02G 11/003; H02G 11/006; H05K 7/1492
USPC .............. 174/69, 72 A, 75 F, 82, 113 R, 70 R
See application file for complete search history.

(56) References Cited

U.S. PATENT DOCUMENTS

| | | | | |
|---|---|---|---|---|
| 3,854,002 | A * | 12/1974 | Glander et al. | 174/69 |
| 4,782,196 | A * | 11/1988 | Ukai | 174/131 A |
| 5,468,159 | A * | 11/1995 | Brodsky et al. | 439/501 |
| 5,481,068 | A * | 1/1996 | Norden | 174/36 |
| 6,176,715 | B1 * | 1/2001 | Buescher | 439/162 |
| 6,559,389 | B1 * | 5/2003 | Kornrumpf et al. | 174/254 |
| 6,603,076 | B2 * | 8/2003 | Doshita et al. | 174/72 A |
| 6,930,244 | B1 * | 8/2005 | Nebel | 174/486 |

(Continued)

FOREIGN PATENT DOCUMENTS

DE    102008050700 A1    4/2010

OTHER PUBLICATIONS

"PowerEdge M1000e", Technical Guide, Dell, Jun. 2010, 1-72 Pages.

(Continued)

*Primary Examiner* — Sherman Ng
(74) *Attorney, Agent, or Firm* — Katherine S. Brown; Jeffrey L. Streets (57) ABSTRACT

A component power cable having a pair of elongate conductive members each connected at a first end to a power distribution unit connector and at a second end to a component power supply connector, wherein the cable has sufficient resilience to impart a generally collapsed configuration to the component power cable, with the first end generally proximal to the second end. The component power cable is extendable from the collapsed configuration to an extended configuration by displacement of the first end to a position distal to the second end, wherein energy stored in the resilient cable by such displacement restores the component power cable to the collapsed configuration upon return of the first end to a position proximal the second end. The resilience may be provided by a spring element or by an elastomeric sheath.

14 Claims, 7 Drawing Sheets

(56) References Cited

U.S. PATENT DOCUMENTS

| | | |
|---|---|---|
| 7,313,000 B2 * | 12/2007 | Fiorentino et al. .............. 361/752 |
| 2001/0004022 A1 * | 6/2001 | Kobayashi ................... 174/72 A |
| 2001/0017216 A1 * | 8/2001 | Mitchem .......................... 174/69 |
| 2005/0006133 A1 * | 1/2005 | Greiner et al. ............. 174/113 R |
| 2010/0006319 A1 * | 1/2010 | Huang ........................... 174/107 |
| 2010/0110628 A1 | 5/2010 | Barrenechea et al. |
| 2010/0147554 A1 | 6/2010 | Ong et al. |
| 2011/0121662 A1 * | 5/2011 | Huang ........................... 307/125 |
| 2011/0141874 A1 | 6/2011 | Starr et al. |
| 2011/0232964 A1 * | 9/2011 | Hashimoto et al. .......... 174/74 R |
| 2012/0069514 A1 | 3/2012 | Ross |

OTHER PUBLICATIONS

Anonymous, "Cable management system for e.g. computer servers in rack, has flexible sleeve through which cables can be routed by opening the slit of sleeve as far as necessary along sleeve, and pushing the cables in and closing the slit", Derwent-Acc-No. 2006-400196, derwent-week: 200641, Copyright 2012 Derwent Information Ltd, May 10, 2006, 2 pages.

* cited by examiner

EXTENDABLE COMPONENT POWER CABLE

BACKGROUND OF THE INVENTION

1. Field of the Invention

The present invention relates to an extendable power cable for providing electrical current to an electronic component supported within a storage rack.

2. Background of the Related Art

Modern computer systems include electronic component storage racks, or server racks, constructed to support a plurality of electrical power-consuming components, such as servers, within the rack. The rack generally comprises a front door, a back door, and a plurality of vertical members connected to a plurality of horizontal rails defining bays into which electrical power-consuming components may be installed. The installed components may be cabled to receive and provide data and to receive electric current supplied through power cables connected thereto.

Generally, racks are constructed to facilitate the convenient installation and removal of components into and from the bays. A component is generally installed to dispose a power supply connector towards a door of the rack so that a component power cable can be conveniently connected to the installed component, and so that the component power cable can be easily disconnected from the component upon removal of the component from the bay. Components supported in a rack are generally installed and/or programmed to facilitate continued operation of remaining components while an individual component is removed for service or replaced.

Most components have data connectors to transmit data to external sources and receive data from external sources, and a power supply connector to receive electrical current necessary to operate the component. Data cables may be interconnected with a remote component, or data cables may be interconnected from one component within the rack to another component within the same rack. Component power cables generally provide current from a remote power source to a component power connector on the component, where the connector is typically disposed towards the back of the rack. This arrangement requires that each of a plurality of component power cables be connected between a power distribution unit and the power supply connector on one of the components.

BRIEF SUMMARY OF THE INVENTION

One embodiment of the present invention provides a component power cable, comprising a pair of elongate electrically conductive members electrically insulated one from the other and extending through a cable jacket, wherein a first end of the pair of elongate electrically conductive members terminates in a first power connector connectable to a power distribution unit, and wherein a second end of the pair of elongate electrically conductive members terminate in a second power connector connectable to an electrical power consuming component. The component power cable further comprises at least one spring element connected to at least a portion of the length of the conductive members and having a generally compact collapsed configuration in a relaxed mode characterized by the first end being generally proximal to the second end. The component power cable is extendable from the collapsed configuration to an extended configuration by application of an extending force to move the first end to a position distal to the second end, wherein energy stored in the at least one spring element by extension of the component power cable from the collapsed configuration to the extended configuration restores the component power cable to the collapsed configuration upon return of the first end to the position proximal to the second end.

Another embodiment of the present invention provides a component power cable, comprising a pair of elongate electrically conductive members electrically insulated one from the other and extending through a cable jacket, wherein a first end of the pair of elongate electrically conductive members terminates in a first power connector connectable to a power distribution unit, and wherein a second end of the pair of elongate electrically conductive members terminate in a second power connector connectable to an electrical power consuming component. The component power cable further comprises a resilient sheath with a plurality of glass fibers dispersed within a generally flexible material surrounding at least a portion of the length of the cable jacket and having a generally compact collapsed configuration in a relaxed mode characterized by the first end being generally proximal to the second end. The component power cable is extendable from the collapsed configuration to an extended configuration by application of an extending force to move the first end to a position distal to the second end, wherein energy stored in the resilient sheath upon extension of the component power cable from the collapsed configuration to the extended configuration restores the component power cable to the collapsed configuration upon return of the first end to the position proximal to the second end.

DETAILED DESCRIPTION OF THE INVENTION

One embodiment of the present invention provides a component power cable having a plug at a first end to conductively connect to a power distribution unit (PDU), a plug at a second end to conductively connect to a component power supply connector on an electronic component, a pair of elongate insulated conductive members within a conductive portion of the component power cable to conduct current from the plug at the first end to the plug at the second end, and a spring element connected along at least a portion of the length of the component power cable intermediate the first end and the second end to impart a collapsed configuration to the component power cable in a relaxed mode and to store energy upon extension of the component power cable from the collapsed configuration to an extended configuration. The spring element may, in one embodiment, comprise a resilient material, such as metal, that is generally elastically deformable from the collapsed configuration to the extendable configuration. The component power cable is extended from the collapsed configuration to the extended configuration as the first end is displaced to a distal position relative to the second end of the component power cable. Extension of the component power cable causes energy to be stored in the spring element. The stored energy is used to return the component power cable from the extended configuration to the collapsed configuration as the first end is positioned proximal to the second end.

In one embodiment, the spring element may comprise a generally flattened piece of elastically deformable material, such as a metal alloy, having a first end and a second end, and bent into a collapsed configuration, such as a U-shape, to position the first end of the spring element proximal to the second end of the spring element. The spring element is extendable by application of a displacing force to elastically deform the spring element by separating the first end from the second end and to thereby store energy in the spring element.

Another embodiment of the present invention provides a component power cable having a pair of elongate conductive members each connected to a power distribution unit connector at a first end to conductively connect the component power cable to a PDU, and the elongate conductive members are each connected to a component connector at a second end to conductively connect to a component power supply connector on an electronic component. The component power cable further comprises a spring element connected along at least a portion of the length of the pair of conductive members intermediate the first end and the second end to impart a collapsed configuration to the portion of the length of the component power cable with the first end proximal to the second end and to store energy upon displacement of the second end of the component power cable to a distal position relative to the first end. The spring element may comprise a sheath or cover comprising a generally insulating material, such as plastic or rubber. Optionally, the sheath or cover may have a plurality of glass fibers dispersed and embedded in the generally insulating material. In one embodiment, the glass fibers comprise approximately 15% by weight of the portion of the sheath or cover. The glass fibers may be encased within the sheath by use of injection molding to form the component power cable in the collapsed configuration so that deformation of the component power cable, and of the sheath containing the glass fibers thereon, to an extended configuration stores energy in the sheath that is used to restore the sheath and the component power cable to the collapsed configuration when the second end is restored to a position proximal the first end. In one embodiment, fiberglass strands are formed into a predefined shape that determines how the cable is to be routed during its collapsed configuration. This preformed fiberglass piece is then laminated into the power cable outside of the insulating material that may be comprised of a rubber or flexible non-conductive plastic.

Embodiments of the component power cable of the present invention may be used, for example, in conjunction with a server storage rack having a plurality of vertically arranged bays to receive a plurality of electrical power-consuming components, an elongate electrical PDU having a plurality of power distribution sockets vertically spaced along the length of the power distribution unit, and a hinge pivotally coupling the PDU to the rack along a vertical axis, wherein the PDU pivots about the hinge between a position proximal to the bays of the rack and a position distal to the bays of the rack. A plurality of component power cables of the present invention, all resiliently extendable from a collapsed configuration to an extended configuration, are each connected between a socket on the PDU and an adjacent one of the electrical power-consuming components supported in the rack. Each of the component power cables are resiliently extendable to the extended configuration in response to pivoting the PDU to the distal position and resiliently restored to the collapsed configuration in response to pivoting the power distribution unit to the proximal position.

Embodiments of the component power cable of the present invention may be similarly used in conjunction with a component power cable management system to prevent obstruction of airflow pathways within a rack supporting electronic components. Airflow pathways are maintained by providing embodiments of the component power cable of the present invention that are predisposed to collapse in a preselected direction so that the collapsed component power cable is deflected to a position away from the airflow pathway through which cooling airflow to or from electronic components flows.

For example, a typical electronic component storage rack may contain a plurality of bays measuring 19 inches in width and have a door hinged to a vertical member of the rack to define a front or rear of the rack. Servers or other electronic components (also generally referred to as "information technology equipment") that are supportable within the bays of a rack are positioned so that the component power cables of the present invention connect to a front or rear panel of the component, data cables connect to a front or rear of the component, and indicators, such as light-emitting diode (LED) indicators, are generally disposed on the front of the component to face towards the front of the rack. The electronic components supportable within bays of the rack are positioned in a common direction to dispose their component power supply connectors towards a common side of the rack to facilitate connecting the electronic components to a PDU secured to the rack. Typically, the power supply connectors of the electronic components are directed toward the rear of the rack, usually towards one side, and the PDU is secured in the rear of the rack to pivot generally near the one side. In a preferred manner of use, the component power cables of the present invention may be used to connect aligned power supply connectors along a side of the electronic components proximal a hinge that supports and pivots a rear door to which the PDU is connected. This arrangement minimizes the cost and length of the component power cables needed to deliver electrical current to the electronic components supported in the rack without obstruction of the airflow pathways that cool the components. The PDU may be coupled to the rack door to move with the rack door as it pivots about the hinge connected between the door and a vertical member of the rack. When the door of the rack is open to provide access to the electronic components supported in the bays of the rack, the component power cables connected between the PDU and the electronic components extend to a generally straightened configuration. This may, for example, be beneficial for one or more reasons, such as to facilitate removal of the component power cable, removal of the corresponding electronic component from a bay of the rack, or installation or removal of data cables. When the rack door is closed, the component power cables collapse to a compact collapsed configuration, such as a U-shaped, coiled, zigzagged or tortuous configuration, to compactly store the component power cables in a small space and without obstructing airflow pathways through the electronic components.

Some embodiments of the component power cables of the present invention are predisposed to collapse to a predetermined compact configuration and to collapse in a preselected direction relative to the orientation of the plugs disposed at the first and second ends of the power supply cable. Deflecting the collapsed portion of the component power cables in a preselected direction prevents the collapsed portion of the component power cable from obstructing airflow pathways within the rack. In one embodiment, a spring element is connected to the component power cable at a strategically selected location along the length of the component power cable and also in a position, relative to the orientation of the PDU connector and the component connector disposed at the first and second ends of the component power cable, respectively, to collapse a preselected portion of the component power cable and also to deflect the collapsed portion in a preselected direction relative to the orientation of the PDU connector and the component connector.

In another embodiment, a sheath comprising a plurality of glass fibers is formed onto a component power cable at a strategic location along the length of the component power cable and the sheath is applied in a manner that causes the relaxed configuration of the component power cable to deflect the collapsed portion in a preselected direction relative to the orientation of the PDU and component connectors at the first and second ends of the component power cables. In these embodiments, the component power cable is extendable, by application of an extending force, from the collapsed configuration to the extended configuration.

Embodiments of the component power cable of the present invention may be used with, for example, an elongate PDU having a main power cable at a first end, a plurality of power distribution sockets spaced along a portion of the length of the PDU, and a hinge for pivotally coupling the PDU to a vertical member of the rack. The main power cable of the PDU is connected to an electrical power source to supply electrical current to each of the plurality of power distribution sockets. A plurality of component power cables of the present invention may be connected at a PDU end to a power distribution socket on the PDU and connected at a component end to an electronic component supported within an adjacent bay of the rack. The extended length of the component power cable is minimized by selecting the power distribution socket of the PDU that is at the same or about the same vertical elevation as the corresponding bay of the rack supporting the electronic component.

Another embodiment of the component power cable of the present invention may be used with an elongate PDU having a main power cable at a first end, a plurality of power distribution sockets spaced along a portion of the PDU, and a hinge pivotally coupling a door to a vertical member of a rack, wherein the PDU is secured to the door. The main power cable is connected to a power source to supply electrical current to each of the power distribution sockets, and a component power cable of the present invention may be connected at a PDU connector to a power distribution socket of the PDU and connected at a component connector to an electronic component supported in an adjacent bay of the rack.

In one application of embodiments of the component power cable of the present invention, a plurality of component power cables conduct current from a plurality of power distribution sockets spaced along a portion of the PDU to a plurality of power supply connectors on a plurality of electronic components supported in the bays of the rack. The number of bays within the rack may be equal to the number of power distribution sockets spaced along a portion of the PDU. In one embodiment, the power distribution sockets of the PDU are spaced along a portion of the PDU to align a power distribution socket with each of a plurality of bays within the rack. This configuration minimizes the extended length and cost of the component power cables.

Figure 1:
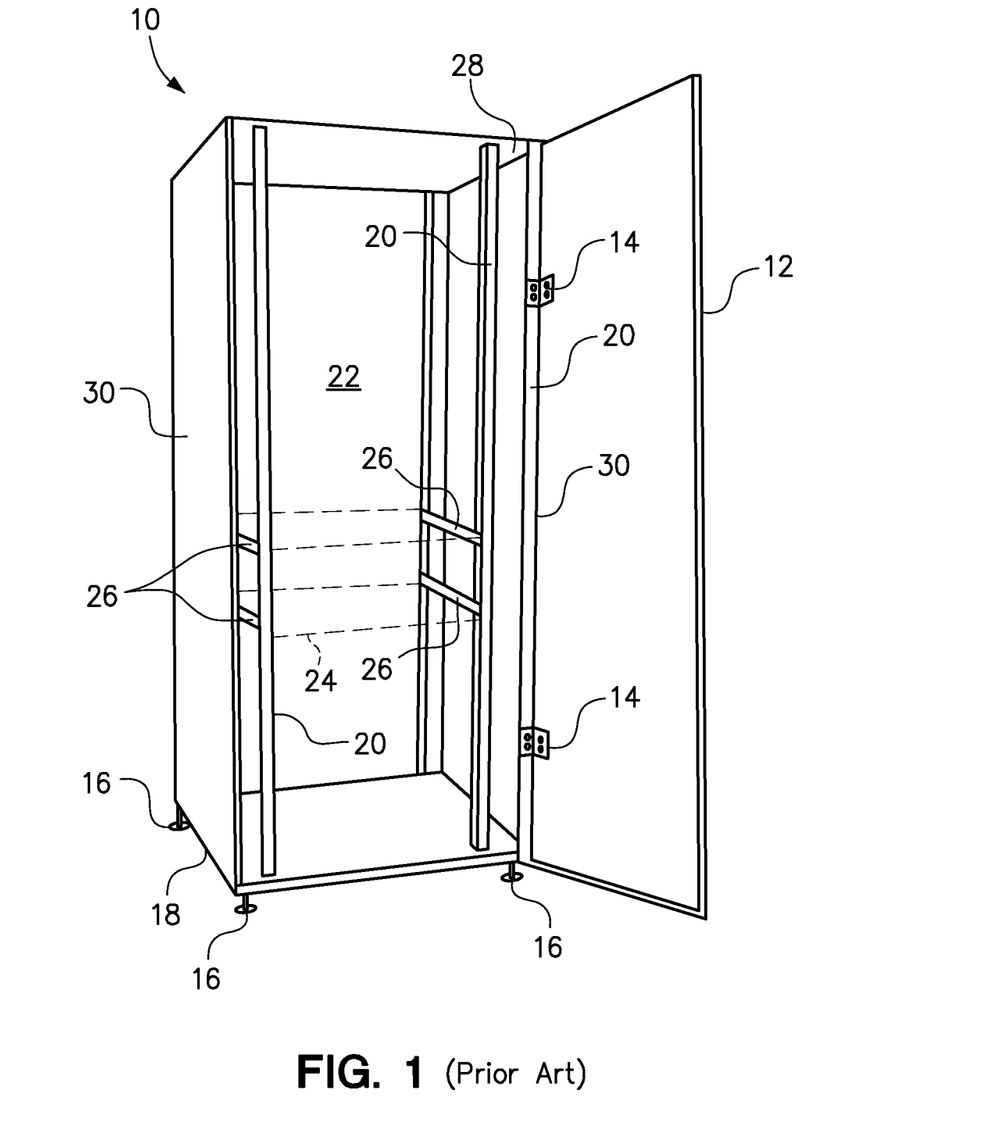
FIG. 1 is a perspective view of an electronic component storage rack having a door pivotally coupled to a vertical member of the rack using hinges.

FIG. 1 is a perspective view of a typical electronic component storage rack 10 having a door 12 pivotally coupled to a vertical member 20 of the rack 10 using hinges 14. The rack 10 may be supported using feet 16 or, alternately, rolling members coupled to a bottom end 18 of the rack 10. The rack 10 of FIG. 1 comprises vertical members 20 which may, in one embodiment, be generally parallel one to the others. A pair of vertical members 20 may be spaced apart, for example, 19 inches one from the other, to define a server space 22 there between. A bay 24 is provided within the server space 22 by installing horizontal rails 26 between the vertical rails 20 to receive and support an electronic component (not shown), such as a server, in a vertically "stacked" configuration within the rack 10. Only two sets of horizontal rails 26 are shown in FIG. 1 for simplicity, but it will be understood that additional horizontal rails 26 can be provided within the server space 22 to define a plurality of vertically aligned bays 24 to receive and support a plurality of "stacked" electronic components (not shown). One or more air movers (not shown), such as fans, may be included in the rack, in a multi-component chassis, or an individual electronic component in order to provide airflow through the electronic components. The lateral space 28 between the side panel 30 of the rack 10 and the adjacent vertical rail 20 defining the server space 22 may, for example, be used for switch mounting (not shown).

Figure 2:
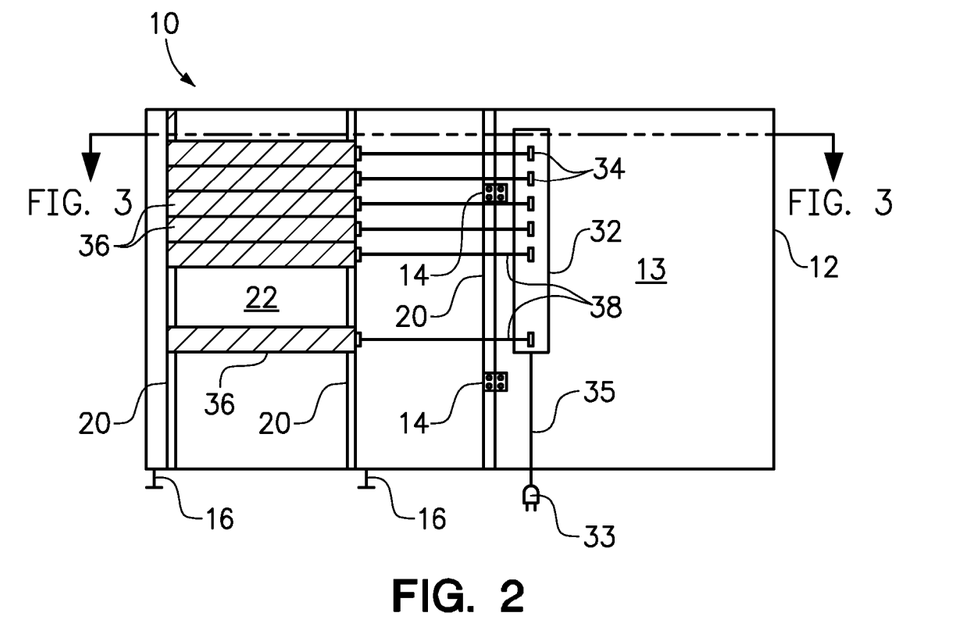
FIG. 2 is a schematic side view of an electronic component storage rack having a power distribution unit disposed in a vertical orientation and secured to a door that is pivotally coupled to the rack.

FIG. 2 is an elevation side view of a rack 10 having an elongate PDU 32 connected in a vertical orientation to a door 12 pivotally coupled by hinges 14 to a vertical member 20 of the rack 10. A side panel (not shown—see side panel 30 of FIG. 1) of the rack 10 is omitted from FIG. 2 to reveal the positions of a plurality of electronic components 36 supported within the server space 22 of the rack 10. The PDU 32 has a plurality of power distribution sockets 34 spaced along a portion of the PDU 32 and a main power cable 35 terminating at a connector 33. A plurality of component power cables 38 are illustrated in an extended configuration and each connected between an electronic component 36 supported within the rack 10 and a power distribution socket 34 on the PDU 32.

Figure 3:
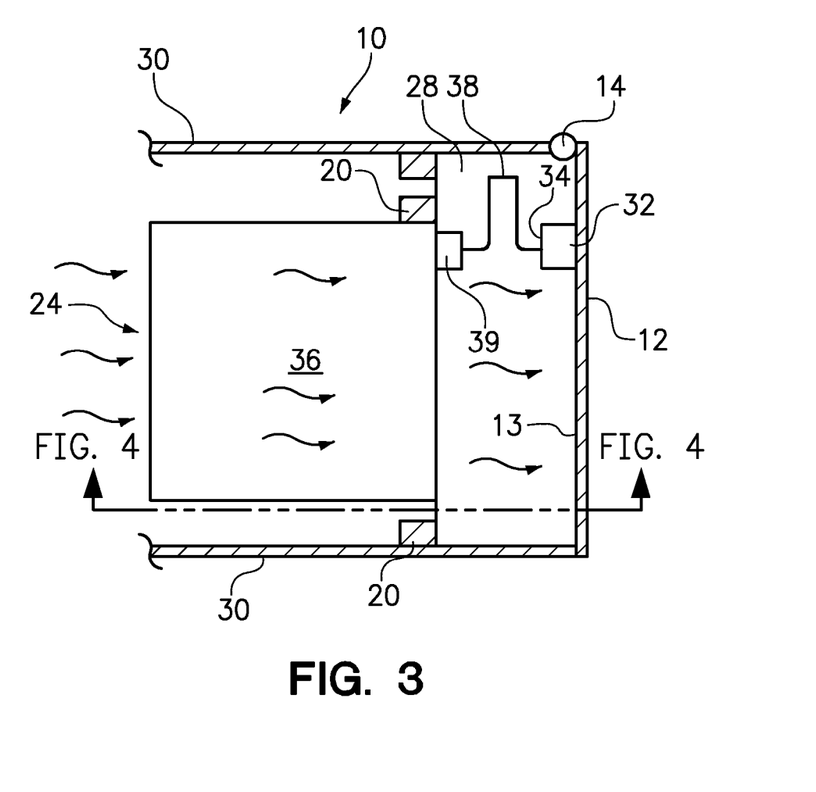
FIG. 3 is a schematic plan view of the power distribution unit and electronic component storage rack of FIG. 2 after the door of the rack is pivoted about the hinge to a closed position.

FIG. 3 is a schematic plan view of the rack 10 of FIG. 2 after the door 12 of the rack 10 is pivoted about hinge 14 to a closed position. The PDU 32 is connected to an interior side 13 of the door 12. Closure of the door 12 disposes the power distribution sockets 34 on the PDU 32 proximal to the power connector 39 on the electronic component 36 in a bay 24 adjacent to the power distribution socket 34 to facilitate collapse of the component power cable 38 from the extended configuration, illustrated in FIG. 2, to the collapsed configuration illustrated in FIG. 3. Preferably, the component power cables 38 are configured to collapse in a direction that disposes the collapsed component power cable 38 of the present invention, or a substantial portion thereof, into the lateral space 28 adjacent to the side panel 30 of the rack 10. The electronic components 36 supported within the rack 10 are structurally similar and, as a result, the power connector 39 on each of the electronic components 36 (See FIG. 2) is generally vertically aligned with the power connectors 39 on other vertically aligned electronic components 36 stored within the rack 10. Preferably, the pivoting of the door 12 to the closed position collapses all of the component power cables 38 so that the component power cables 38 of the present invention are disposed within the lateral space 28 where they will not interfere with airflow through the electronic components 36.

Figure 4:
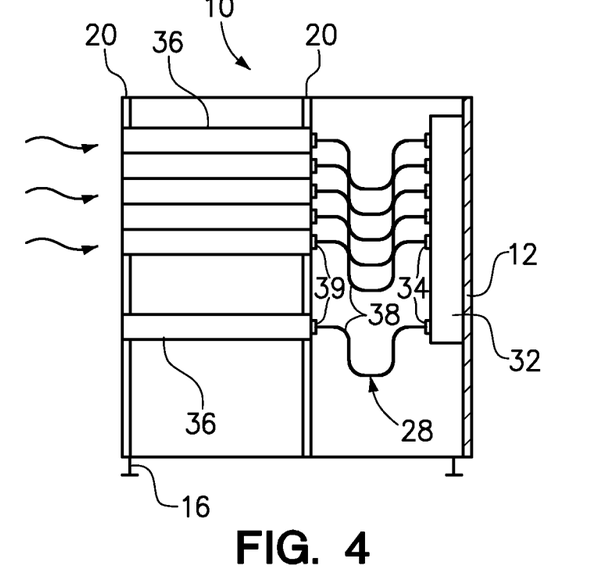
FIG. 4 is a schematic side view of the apparatus in FIG. 3 revealing the plurality of component power cables in the collapsed configuration and residing in a space laterally adjacent to the component bays of the rack.

FIG. 4 is the schematic side view of the rack illustrated in FIG. 3 revealing the plurality of component power cables 38 of the present invention in the collapsed configuration and residing in the lateral space 28 in the rack 10. The capacity of the component power cables 38 to collapse for convenient storage in the lateral space 28 facilitates the favorable removal of heat generated within the electronic components 36 by preventing obstruction of airflow pathways, i.e. by preventing blockage of warmed air discharged from the rear of the electronic components 36 or, in other applications, preventing blockage of cooling airflow into the front of the component 36. The collapsed component power cables 38 are each disposed intermediate a power distribution socket 34 on the PDU 32 and a power connector 39 on an electronic component 36. The generally U-shaped, collapsed configuration of the embodiment of the component power cables 38 illustrated in FIG. 4 is generally determined by the characteristics of the component power cable 38 and also by the proximity of the power distribution socket 34 of the PDU 32 to the power connector 39 when the door 12 is in the closed position shown in FIG. 4. The configuration of the component power cables 38 in the collapsed configuration will vary with the distance from the power distribution socket 34 of the PDU 32 to the power connector 39 on the electronic component 36 when the door 12 is in the closed position, and the collapsed configuration of the component power cable 38 will vary depending on factors such as the orientation of a spring element, relative to the connectors (not shown) at the ends, the stiffness of the component power cable 38 and the method of manufacture.

Figure 5:
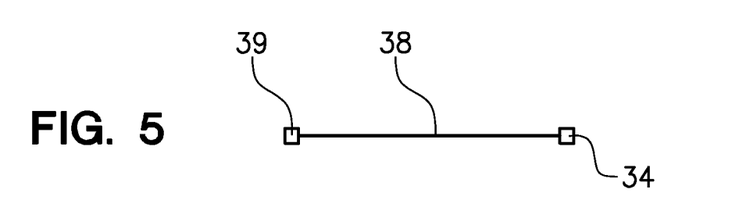
FIG. 5 is a diagram of an individual component power cable that can be used in connection with embodiments of the present invention in an extended configuration corresponding to the open position of the door illustrated in FIG. 2.

FIG. 5 is a diagram of an alternate embodiment of the component power cable 38 of the present invention. FIG. 5 illustrates the component power cable 38 in an extended configuration corresponding to the position of the door 12 illustrated in FIG. 2. FIG. 5 illustrates the component power cable 38 at generally full extension to span the distance from the power distribution socket 34 on the PDU 32 to the power connector 39 on the electronic component 36.

Figure 6:
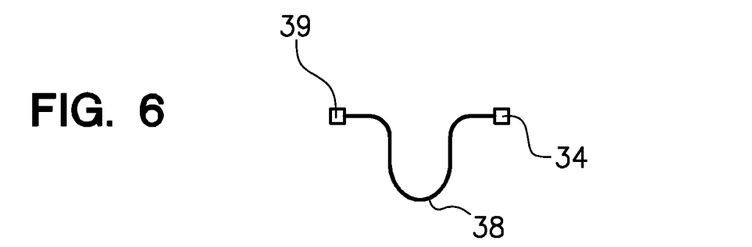
FIG. 6 is a diagram of the component power cable of FIG. 5 in a partially collapsed configuration corresponding to closed position of the door as illustrated in FIGS. 3 and 4.

FIG. 6 is a diagram of the embodiment of the component power cable 38 of FIG. 5 in a collapsed configuration corresponding to the closed position of the door illustrated in FIGS. 3 and 4. The pivoting of the door (not shown) relative to the server rack (not shown) moves the power distribution socket 34 on the PDU (not shown) closer to the power connector 39 on the electronic component (not shown) to reduce the distance between the two and to facilitate the collapse of the component power cable 38 to a generally U-shaped configuration. This configuration for this embodiment of the component power cable 38 of the present invention is obtained in a manner explained below in connection with FIGS. 8-12.

Figure 7:
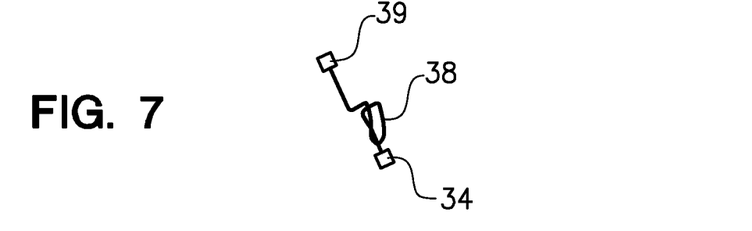
FIG. 7 is a diagram of an alternate component power cable that collapses into a tortuous path when the door is pivoted to a closed position.

FIG. 7 is a diagram of yet another embodiment of the power supply cable 38 in a further collapsed configuration corresponding to the closed position of the door 12 (illustrated in FIGS. 3 and 4). The pivoting of the door (not shown) relative to the rack (not shown) to the closed position corresponding to FIGS. 3 and 4 moves the power distribution socket 34 on the PDU (not shown) proximal to the power supply connector 39 on the component (not shown) to minimize the distance between the two and to facilitate the collapse of the power supply cable 38 to a compact configuration, for example, the tortuous configuration illustrated in FIG. 7.

It will be understood that the collapse/extension of the component power cables 38 illustrated in FIGS. 5-7 is repeatable. The component power cable 38 behaves as a spring element. In other words, the component power cable 38 can be forcibly extended from its collapsed configuration to an extended configuration and, by removal of the extending force, it can be substantially restored to its collapsed configuration. The spring element behavior of the component power cable 38 eliminates the need for external springs or other cable management devices that consume space, require external connections, and interfere with other structures within the rack 10.

The preferred materials selected for the power cables 38 are generally resistant to loss of shape "memory" due to heating by the warm air discharged from the servers and due to cyclic extension and collapse from opening and closing the door 12 of the rack 10. Also, the force required to maintain all of the component power cables 38 in the extended position is preferably not be so great as to prevent the door 12 from remaining in the open position, for example, while individual servers are being cabled, removed or installed.

Figure 8:
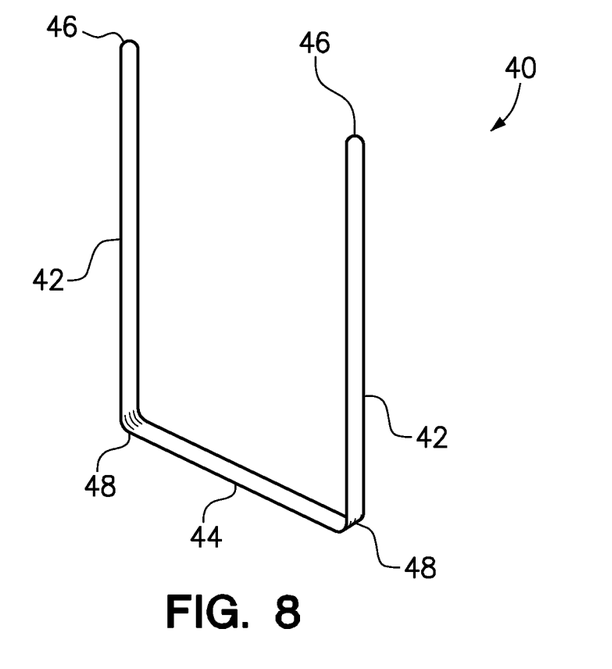
FIG. 8 is a perspective view of a spring element configured to be used in connection with an embodiment of the component power cable of the present invention.

FIG. 8 is a perspective view of a spring element 40 configured to be used in connection with an embodiment of the component power cable (not shown in FIG. 8) of the present invention. The spring element 40 comprises a base 44 connected at bends 48 to extensions 42 from the base 44 and terminating at ends 46. The spring element 40 may comprise a resilient material that can be elastically deformed such as, for example, a metal alloy. As shown, the spring element 40 is in a bent or collapsed configuration where the ends 46 are proximal to each other. However, the spring element 40 can be elastically deformed by deformation of the bends 48 to a straight configuration to separate the ends 46 one distal to the other and to thereby extend the spring element 40 to an elongate and generally straightened configuration.

Figure 9:
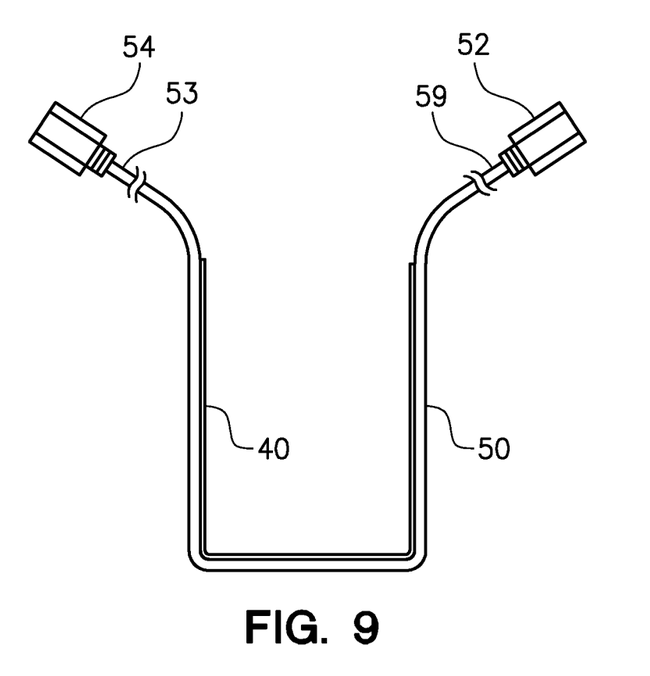
FIG. 9 is the spring element of FIG. 8 positioned adjacent to a conventional power cable for being connected thereto.

FIG. 9 is the spring element 40 of FIG. 8 positioned adjacent to a conventional component power cable 50 for being connected thereto. The conventional component power cable 50 has a PDU connector 54 at a first end 53 and a component connector 52 at a second end 59 of the conventional component power cable 50. The conventional component power cable 50 is illustrated as having been bent at strategic locations to generally conform to the U-shape of the adjacent spring element 40 to facilitate connection of the spring element 40 to the conventional component power cable 50.

Figure 10:
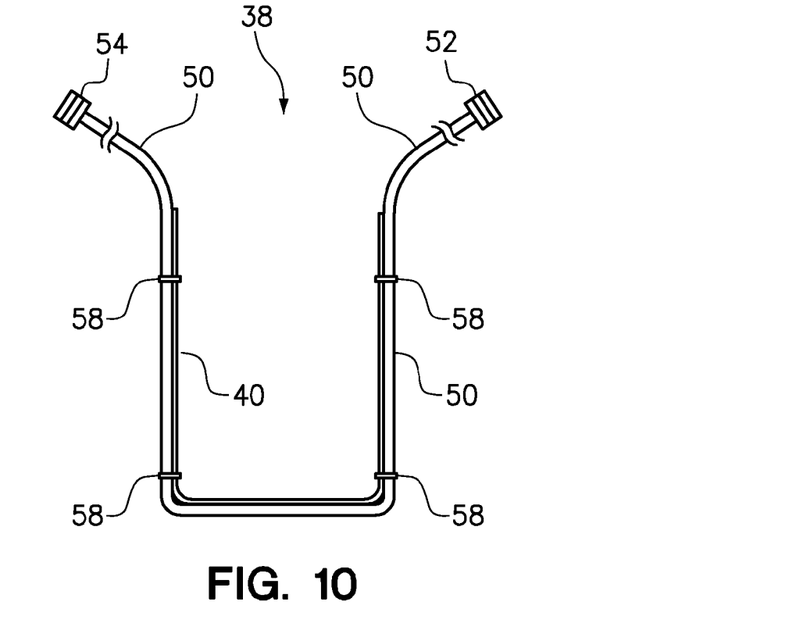
FIG. 10 is one embodiment of the component power cable of the present invention comprising the spring element and conventional power cable of FIG. 9 connected one to the other.
Figure 15:
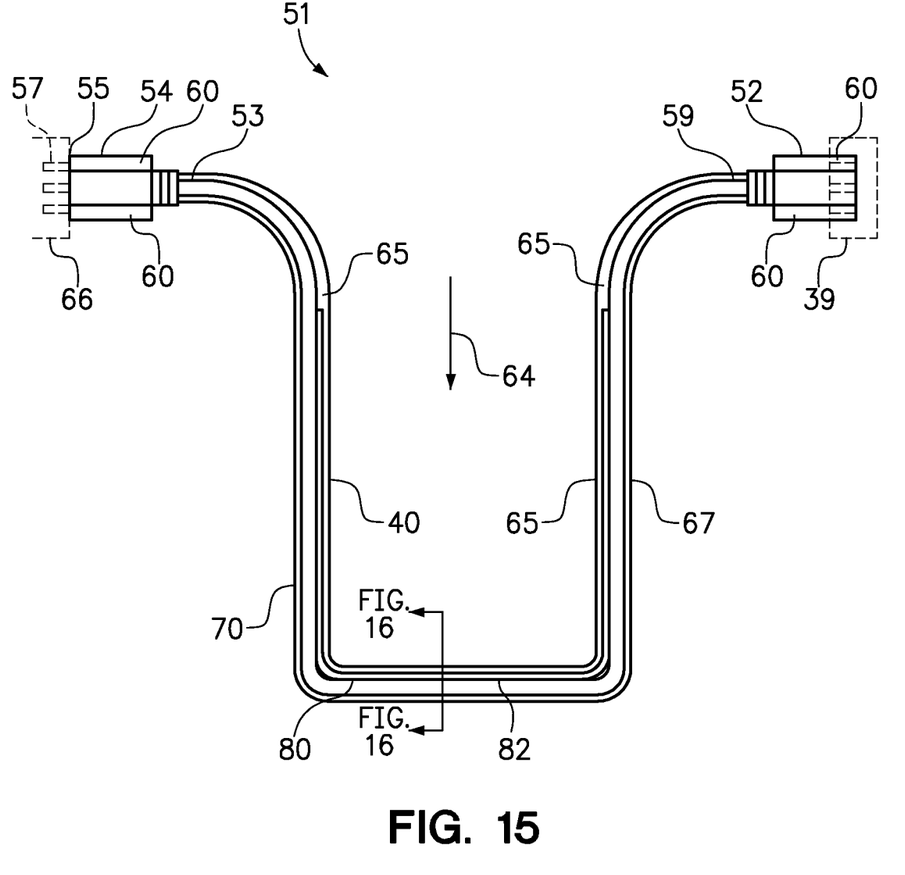
FIG. 15 is a sectional plan view of an embodiment of a component power cable of the present invention that is deflected by a spring element towards a preselected lateral direction upon being restored from an extended configuration to a collapsed configuration.
Figure 16:
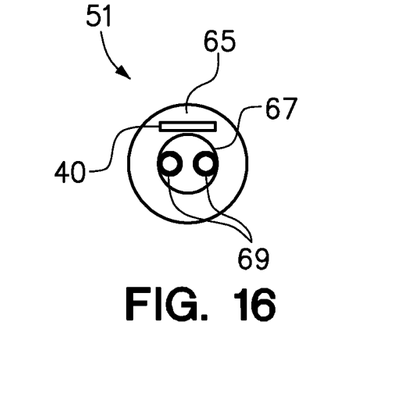
FIG. 16 is a cross-section view of the embodiment of the component power cable of FIG. 15 revealing an arrangement of the spring element and the conductive portion surrounded by a sheath.
Figure 17:
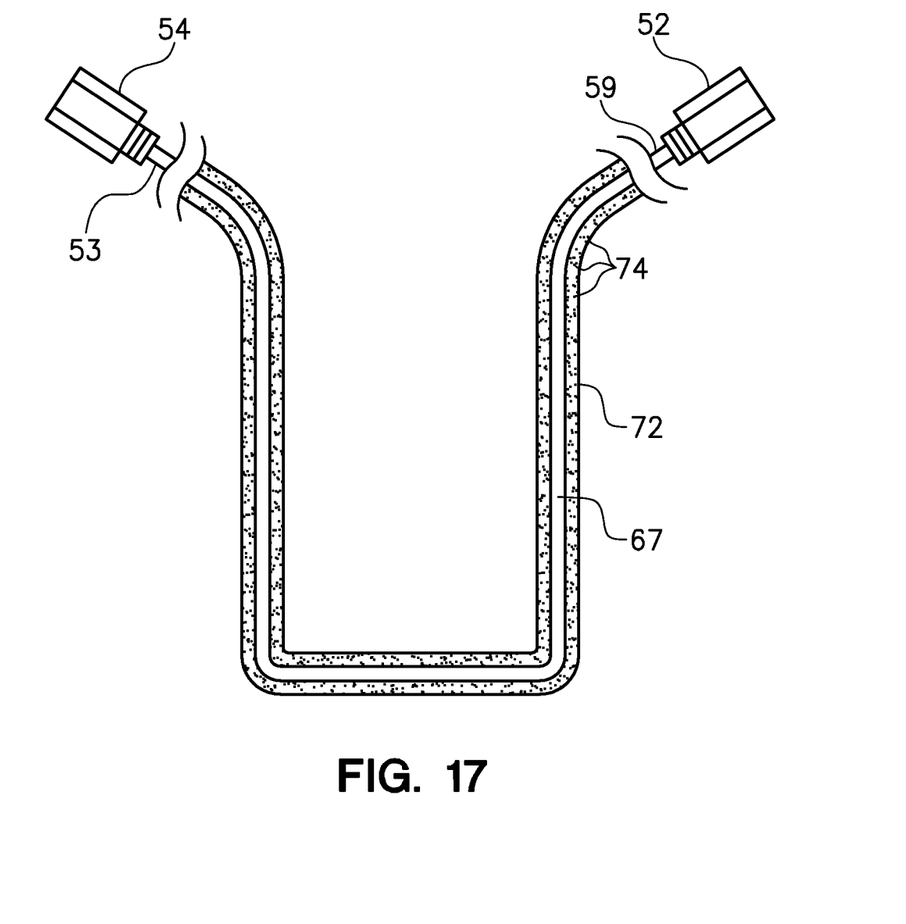
FIG. 17 is a sectional plan view of an alternate embodiment of a component power cable of the present invention that is deflected by an alternate spring element towards a preselected lateral direction upon being restored from an extended configuration to a collapsed configuration.

FIG. 10 is one embodiment of the component power cable 38 of the present invention, in a collapsed configuration, comprising the spring element 40 connected to the conventional component power cable 50 of FIG. 9 using a plurality of bands 58. For example, each band 58 may be a plastic zip tie. The spring element 40 of the component power cable 38 of the present invention deflects the collapsed portion of the power cable in a preselected direction to facilitate the maintenance of open airflow pathways within the server rack environment. The direction of deflection of the collapsed component power cable 38 is manipulated by strategically disposing the spring element 40 on or within the component power cable 38 in an orientation, relative to the connectors 52, 54 disposed at the ends of the component power cable 38, to generate the desired direction of deflection. The relationship between the orientations of the connectors and the spring element 40 and the direction of deflection of the component power cable 38 in the collapsed configuration is illustrated in FIGS. 15-17.

Figure 11:
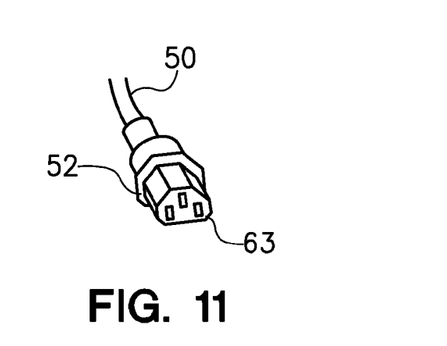
FIG. 11 is a perspective view of a component connector of a component power cable for engaging the power supply connector on an electronic component.

FIG. 11 is a perspective view of a conventional and horizontally asymmetrical component connector 52 having a peripheral profile 63 requiring proper orientation of the component connector 52 for conductive engagement with, for example, a power supply connector on an electronic component (see power supply connector 39 on electronic component 36 in FIG. 3).

Figure 12:
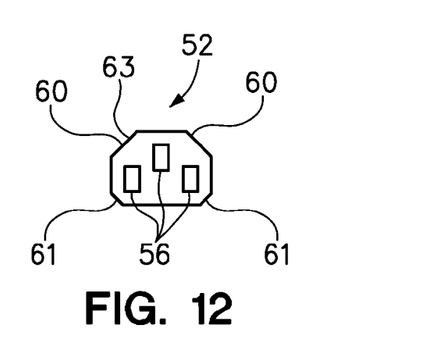
FIG. 12 is a perspective view of a power distribution unit connector for engaging a power supply socket on a power distribution unit.

FIG. 12 is an end view of the of the component connector 52 of FIG. 11 illustrating an arrangement of three female slots 56 to receive three corresponding male prongs (not shown) extending from the component (not shown) to which the component connector 52 can be conductively connected. The component connector 52 has a profile 63 having a pair of heavily cropped and upwardly disposed corners 60 opposite a pair of lightly cropped and downwardly disposed corners 61 to provide a peripheral profile to mate with a corresponding socket within or on the electronic component.

Figure 13:
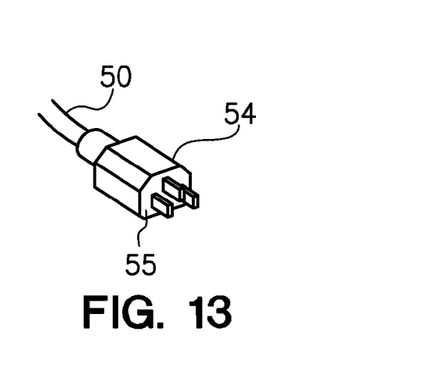
FIG. 13 is an end view of the component connector of FIG. 11 revealing the horizontally asymmetrical profile of the component connector requiring proper orientation for engagement with a power supply connector on an electronic component.

FIG. 13 is a perspective view of a conventional and horizontally asymmetrical PDU connector 54 having a peripheral profile requiring proper orientation of the PDU connector 54 for conductive engagement with, for example, a power supply socket of a PDU (see power supply socket 34 on the power distribution unit 32 in FIG. 3).

Figure 14:
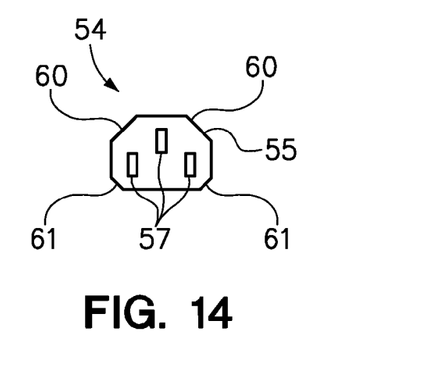
FIG. 14 is an end view of the power distribution unit connector of FIG. 12 revealing the horizontally asymmetrical profile of the power distribution connector requiring proper orientation for engagement with a power supply socket on a power distribution unit.

FIG. 14 is an end view of the PDU connector 54 of FIG. 13 illustrating an arrangement of three male prongs 57 to be received within corresponding slots (not shown) in a power supply socket (not shown) of a PDU (not shown). The PDU connector 54 has a profile 55 having a pair of heavily cropped and upwardly disposed corners 60 opposite a pair of lightly cropped and downwardly disposed corners 61 to provide a peripheral profile to mate with a socket with the PDU socket.

FIG. 15 is a sectional plan view of an embodiment of a power cable 51 of the present invention that is adapted for deflecting in a preselected lateral direction 64 as it is restored from an extended configuration (as in FIG. 2) to the collapsed configuration illustrated in FIG. 15. The component power cable 51 comprises a first end 53 having a PDU connector 54 connected to a PDU socket 66 on a PDU (not shown), and a second end 59 having a component connector 52 connected to a connector 39 on an electronic component (not shown) supported in a bay of a rack (not shown). The PDU connector 54 and the component connector 52 are not shown in section view in order to reveal the heavily cropped and upwardly disposed corners 60. The portion of the component power cable 51 between the PDU connector 54 and the component connector 52 are shown in section to reveal the position and orientation of the spring element 40 relative to a current conducting portion 67 of the component power cable 51 and relative to the direction 64 of deflection produced by the spring element 40. The spring element 40 and the conductive portion 67 of the component power cable 51 are encased within an insulating, flexible sheath 65. It will be understood that the elongate pair of conductive members (not shown in FIG. 15—see conductive member 69 in FIG. 16) that conduct current through the component power cable 51 are within the conductive portion 67 of the component power cable 51 illustrated in FIG. 15.

The spring element 40 is oriented, relative to the PDU connector 54 and the component connector 52, at the "9 o'clock" position on the portion 70 of the length of the component power cable 51, and in the perspective of one viewing the component connector 52. This position corresponds to the "3 o'clock" position on the portion 70 of the length of the component power cable 51 in the perspective of one viewing the PDU connector 54. It will be understood that the PDU connector 54 and the component connector 52 remain in the positions shown in the plan view of FIG. 15 due to the mating engagement between the horizontally asymmetrical profiles of the PDU connector 54 and the component connector 52, and these positions remain constant as the PDU connector 54 is pivoted, along with the PDU socket 66 to which it is connected, away from the component connector 52 during opening of the door to which the PDU is secured. It will be understood that the spring element 40, when being returned to the collapsed configuration illustrated in FIG. 15 from the extended configuration (see FIGS. 2 and 5), will predictably restore to its relaxed configuration shown in FIGS. 8-10 and 15 and pull the conductive portion 67 around it to deflect the component power cable 51 in the direction 64 illustrated in FIG. 15. It will be further understood that the opposite result, a deflection in a direction opposite the direction 64, would be obtained if the spring element 40 is positioned at the "9 o'clock" position on the portion 70 of the length of the component power cable 51 in the perspective of one viewing the component connector 52 or, alternately, in the "3 o'clock" position on the portion 70 of the length of the component power cable 51 in the perspective of one viewing the PDU connector 54. Alternately, positioning the spring element at the "12 o'clock" position (in either perspective) would produce an upwardly deflection and positioning the spring element 40 at the "6 o'clock" position would produce a downwardly deflection. It will be understood that the spring element 40 can be adapted for use in configurations other than the U-shaped configuration illustrated in FIGS. 2, 5, 8-10 and 15, and that in other configurations, like in the U-shaped configuration, the orientation of the spring element 40 relative to the PDU connector 54 and the component connector 52 can be manipulated to produce the desired direction of deflection of the collapsed component power cable 51.

In an optional embodiment, the component power cable 51 may include first and second spring elements, such as by omitting the section of spring element 40 that is between two points 80, 82. Accordingly, the first and second spring elements are strategically connected to generally adjacent portions of the length of the conductive members within the component power cable.

FIG. 16 is a section view of the component power cable 51 of FIG. 15 illustrating one possible arrangement of conductive members 69, a conductive member sub-casing 67 (such as a cable jacket) and the spring element 40 within the encasement 65 to produce the direction 64 (see FIG. 15) illustrated in FIG. 15.

FIG. 17 is an alternate embodiment of the component power cable 38, 51 of the present invention having a conductive portion 67 connected at a first end 53 to a PDU connector 54 and at a second end 59 to a component connector 52. The component power cable further includes a resilient sheath 72 surrounding the conductive portion 67. The resilient sheath may be made from an elastomer. In one optional embodiment, the resilient sheath comprises approximately 15% by weight glass fibers 74. The glass fibers 74 are dispersed within the sheath 67 surrounding the conductive portion 67 of the component power cable, and impart resilience to the sheath 72 to restore the component power cable to the collapsed configuration illustrated in FIG. 17 upon removal of an extending force.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A component power cable, comprising:
   a pair of elongate electrically conductive members electrically insulated one from the other and extending through a cable jacket, wherein a first end of the pair of elongate electrically conductive members terminates in a first power connector connectable to a power distribution unit, and wherein a second end of the pair of elongate electrically conductive members terminate in a second power connector connectable to an electrical power consuming component;
   at least one spring element connected to at least a portion of the length of the conductive members and having a generally compact collapsed configuration in a relaxed mode characterized by the first end being generally proximal to the second end;
   wherein the component power cable is extendable from the collapsed configuration to an extended configuration by application of an extending force to move the first end to a position distal to the second end; and
   wherein energy stored in the at least one spring element by extension of the component power cable from the collapsed configuration to the extended configuration restores the component power cable to the collapsed configuration upon return of the first end to the position proximal to the second end.

2. The component power cable of claim 1, wherein the at least one spring element is connected along the portion of the length of the conductive members by a generally flexible sheath surrounding the spring element and the pair of conductive members.

3. The component power cable of claim 2, wherein the flexible sheath is made with an electrically insulating material.

4. The component power cable of claim 2, wherein the flexible sheath is made with an elastomer.

5. The component power cable of claim 2, wherein the generally flexible sheath is injection molded about the spring element and the pair of conductive members.

6. The component power cable of claim 1, wherein the at least one spring element is connected along the portion of the length of the conductive members using a plurality of spaced apart connecting elements.

7. The component power cable of claim 6, wherein the at least one spring element comprises first and second spring elements strategically connected to generally adjacent portions of the length of the conductive members.

8. The component power cable of claim 7, wherein the first spring element imparts a first bend in the conductive members in the collapsed configuration and the second spring element imparts a second bend in the collapsed configuration.

9. The component power cable of claim 8, wherein the second bend is generally adjacent the first bend and generally offsetting the first bend in the collapsed configuration.

10. The component power cable of claim 7, wherein the at least one spring element further comprising a third spring element and a fourth spring element connected along the portion of the length of the component power cable to straddle the first and second spring elements and to impart a third bend and a fourth bend in the component power cable in the collapsed configuration.

11. A component power cable, comprising:
    a pair of elongate electrically conductive members electrically insulated one from the other and extending through a cable jacket, wherein a first end of the pair of elongate electrically conductive members terminates in a first power connector connectable to a power distribution unit, and wherein a second end of the pair of elongate electrically conductive members terminate in a second power connector connectable to an electrical power consuming component;
    at least one spring element connected to at least a portion of the length of the conductive members and having a generally compact collapsed configuration in a relaxed mode characterized by the first end being generally proximal to the second end;

wherein the component power cable is extendable from the collapsed configuration to an extended configuration by application of an extending force to move the first end to a position distal to the second end;

wherein energy stored in the at least one spring element by extension of the component power cable from the collapsed configuration to the extended configuration restores the component power cable to the collapsed configuration upon return of the first end to the position proximal to the second end;

wherein the at least one spring element is connected along the portion of the length of the conductive members by a generally flexible sheath surrounding the spring element and the pair of conductive members; and wherein the at least one spring element comprises first and second spring elements strategically connected to generally adjacent portions of the length of the conductive members.

12. The component power cable of claim 11, wherein the first spring element imparts a first bend in the conductive members in the collapsed configuration and the second spring element imparts a second bend in the collapsed configuration.

13. The component power cable of claim 12, wherein the second bend is generally adjacent the first bend and generally offsetting the first bend in the collapsed configuration.

14. The component power cable of claim 11, wherein the at least one spring element further comprising a third spring element and a fourth spring element connected along the portion of the length of the component power cable to straddle the first and second spring elements and to impart a third bend and a fourth bend in the component power cable in the collapsed configuration.

* * * * *